United States Patent [19]
Lin et al.

[11] Patent Number: 6,071,794
[45] Date of Patent: Jun. 6, 2000

[54] METHOD TO PREVENT THE FORMATION OF A THINNER PORTION OF INSULATING LAYER AT THE JUNCTION BETWEEN THE SIDE WALLS AND THE BOTTOM INSULATOR

[75] Inventors: Ping-Wei Lin, Chiayi; Ming-Kuan Kao, Hsinchu; Jui-Ping Li, Ilan Hsien, all of Taiwan

[73] Assignee: Mosel Vitelic, Inc., Hsinchu, Taiwan

[21] Appl. No.: 09/323,746

[22] Filed: Jun. 1, 1999

[51] Int. Cl.⁷ .................................................. H01L 21/76
[52] U.S. Cl. .......................... 438/424; 438/425; 438/702
[58] Field of Search .................................... 438/696, 700, 438/702, 703, 745, 756, 424, 427, 425

[56] References Cited

U.S. PATENT DOCUMENTS

| | | | |
|---|---|---|---|
| 4,900,692 | 2/1990 | Robinson ................................... | 437/67 |
| 4,994,406 | 2/1991 | Vasquez et al. .......................... | 437/67 |
| 5,098,856 | 3/1992 | Beyer et al. ............................... | 437/65 |
| 5,183,775 | 2/1993 | Levy ......................................... | 437/60 |
| 5,298,790 | 3/1994 | Harmon et al. .......................... | 257/622 |
| 5,650,639 | 7/1997 | Schrantz et al. .......................... | 257/77 |
| 5,783,476 | 7/1998 | Arnold ..................................... | 438/425 |
| 5,911,109 | 6/1999 | Razouk et al. ........................... | 438/424 |

*Primary Examiner*—Matthew Smith
*Assistant Examiner*—Renzo Rocchegiani
*Attorney, Agent, or Firm*—Chien-Wei (Chris) Chou; Oppenheimer Wolff & Donnelly LLP

[57] ABSTRACT

A method to prevent the formation of a thinner portion of insulating layer, especially a gate oxide layer, at the junction between the side walls and the bottom insulator is disclosed. First, a pad oxide layer is formed on the side walls and the bottom of the trench. Next, a bottom oxide is formed on the lower portion of the trench. Then, the upper portion of the bottom oxide and the exposed pad oxide layer are removed by wet etching to leave a bottom oxide having a concave surface. Next, the conformal gate oxide layer is grown on the exposed side walls of the trench.

17 Claims, 5 Drawing Sheets ical side views showing the manufacturing steps of a gate oxide layer of a trench type semiconductor device in accordance with the prior art; and

METHOD TO PREVENT THE FORMATION OF A THINNER PORTION OF INSULATING LAYER AT THE JUNCTION BETWEEN THE SIDE WALLS AND THE BOTTOM INSULATOR

BACKGROUND OF THE INVENTION

1. Field of the Invention

The present invention relates to a method for fabricating semiconductor devices, and more particularly to a method to prevent the formation of a thinner portion of gate oxide at the junction between the side walls and the bottom insulator of a trench type semiconductor device.

2. Description of the Prior Art

As the design rule continues to shrink, a trench type semiconductor device, for example metal-oxide-semiconductor transistor, has been provided to economize the wafer area.

Referring to FIGS. 1A through 1C, the cross-sectional side views of a conventional method for fabricating a gate oxide within a trench are depicted in sequence.

Referring now to FIG. 1A, a cross-sectional view of the first step is schematically shown. FIG. 1A shows a silicon substrate 10 having a trench 12. A silicon nitride layer 11 is formed overlaying the silicon substrate 10.

Next, as shown in FIG. 1B, a bottom oxide 16 is deposited on the lower portion of the trench 12 by high density plasma chemical vapor deposition (HPCVD).

Referring now to FIG. 1C, a gate oxide layer 18, for example silicon oxide having a thickness of about 500 angstroms, is grown on the side walls of the trench 12.

However, the gate oxide layer 18 is naturally thinner at the junction 20 between the side walls and the bottom oxide 16. This thinner portion will cause junction leakage problems.

SUMMARY OF THE INVENTION

In view of the above disadvantages, an object of the invention is to provide a method to prevent the formation of a thinner portion of oxide layer at the junction between the side walls and the bottom oxide.

It is a further object of the invention to provide a method to avoid junction leakage.

The above objects are attained by providing a method to prevent the formation of a thinner portion of insulating layer suitable for a semiconductor substrate having a trench comprising the steps of: (a) forming a pad insulating layer on the side walls and the bottom of said trench; (b) forming a bottom insulator over said pad insulating layer, said bottom insulator filled within said trench; (c) etching the upper portion of said bottom insulator to form a bottom insulator having a concave surface; and (d) forming an insulating layer on the side walls of said trench.

The above objects are also attained by providing a method to prevent the formation of a thinner portion of oxide layer suitable for a semiconductor substrate having a trench comprising the steps of: (a) forming a bottom insulator having a concave surface on the bottom of said trench; and (b) forming an oxide layer on the side walls of said trench.

An aspect of the invention is to provide a method to prevent the formation of a thinner portion of insulating layer in which said insulating material is oxide material.

Another aspect of the invention is to provide a bottom insulator (oxide) which has a specially shaped surface, especially concave shaped, for growing a conformal gate oxide layer.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through 2E of the drawings.

Figure 1A:
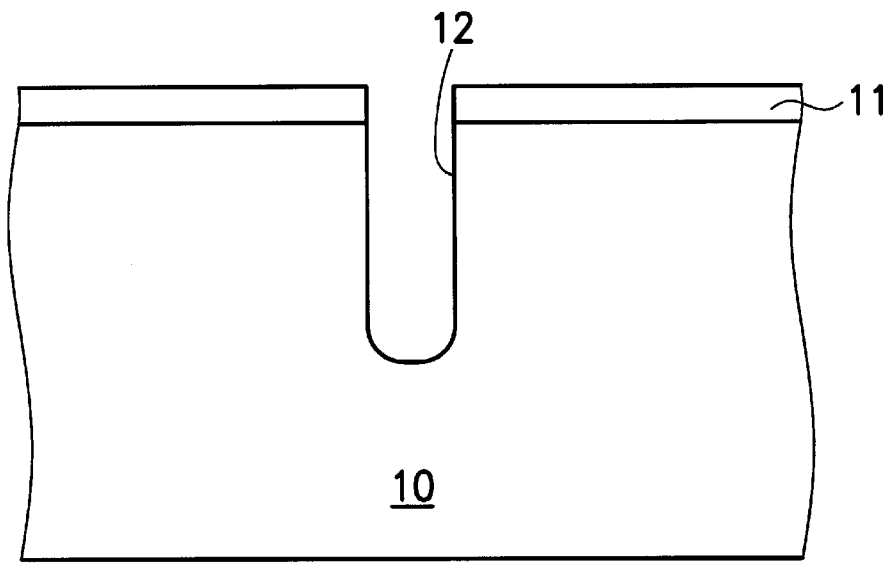
FIGS. 1A through 1C are cross-sectional side views showing the manufacturing steps of a gate oxide layer of a trench type semiconductor device in accordance with the prior art.
Figure 1B:
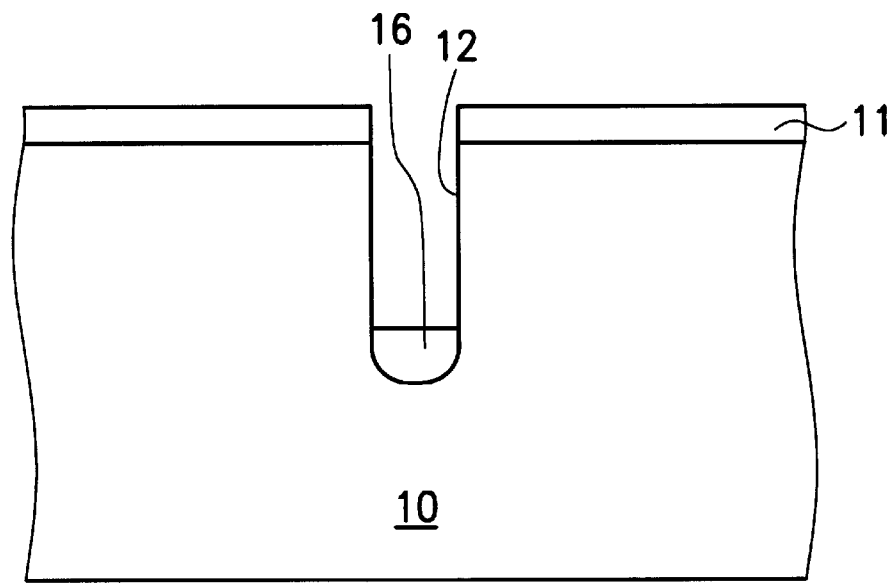
Figure 1C:
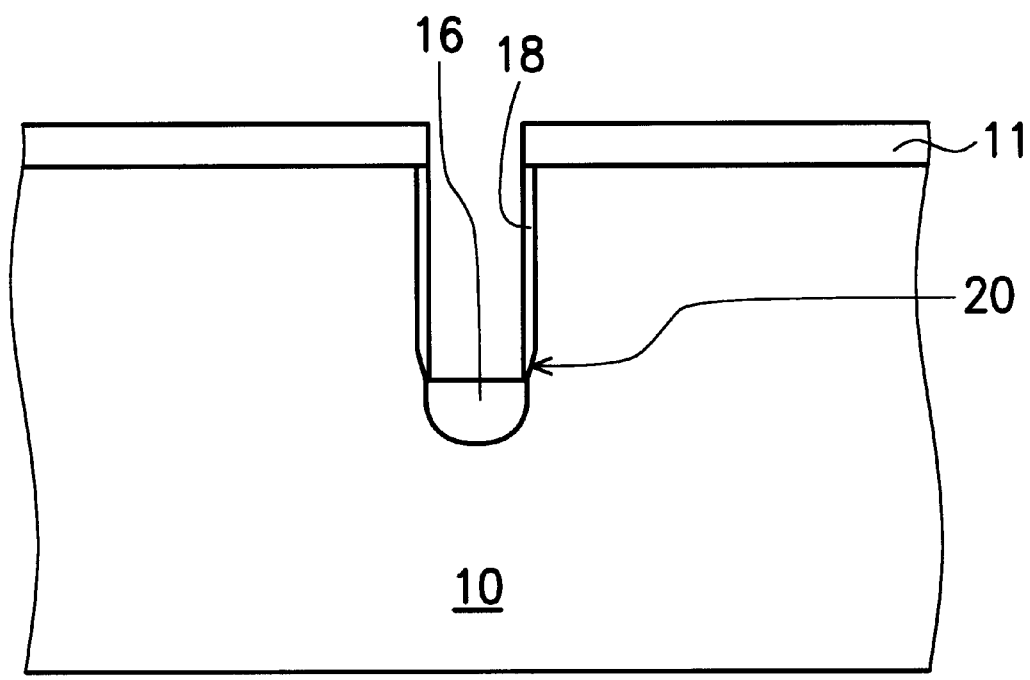
Figure 2A:
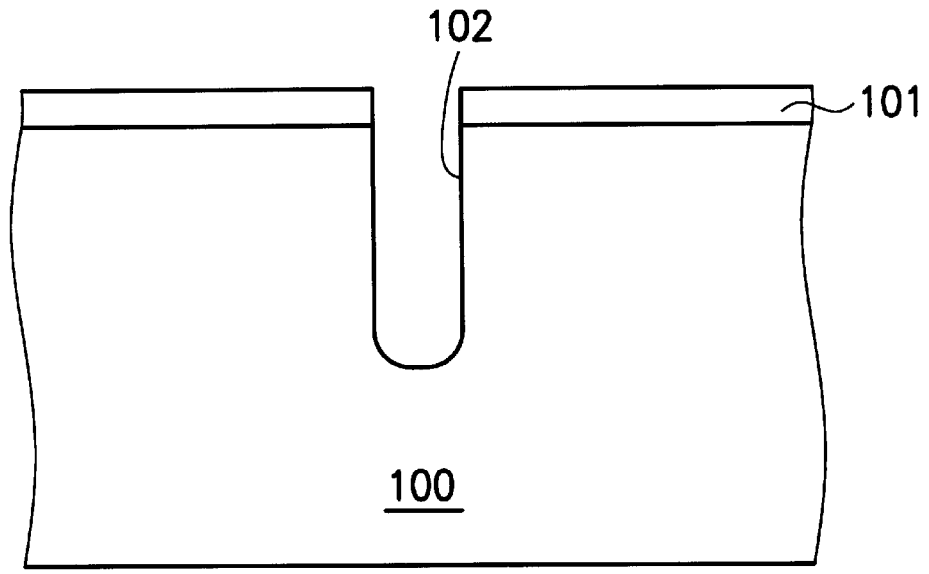
FIGS. 2A through 2E are cross-sectional side views showing the manufacturing steps of a gate oxide layer of a trench type semiconductor device in accordance with the invention.

Referring now to FIG. 2A, a cross-sectional view of the first step is schematically shown. In FIG. 2A, a trench 102 having a depth of about 15000 to 20000 angstroms is formed by anisotropic etching in a semiconductor substrate 100 such as p-type monocrystalline silicon substrate. Preferably, a silicon nitride layer 101 is formed on the semiconductor substrate 100.

Figure 2B:
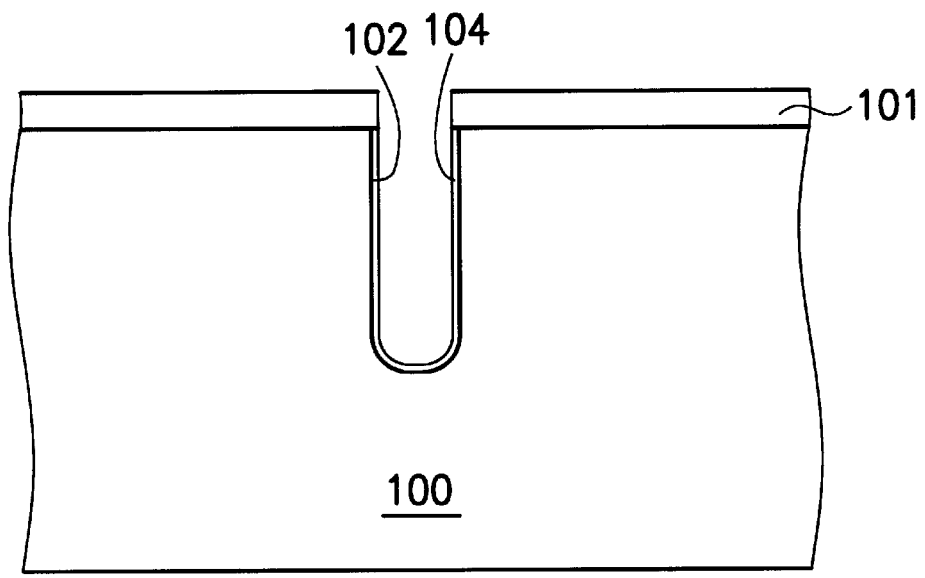

Next, as shown in FIG. 2B, a pad oxide layer 104 is formed on the side walls and the bottom of the trench 102 by a thermal oxidation process at a temperature of about 850 to 1000 degrees C. Alternatively, the pad oxide layer 104 could be formed by low pressure chemical vapor deposition (LPCVD).

Figure 2C:
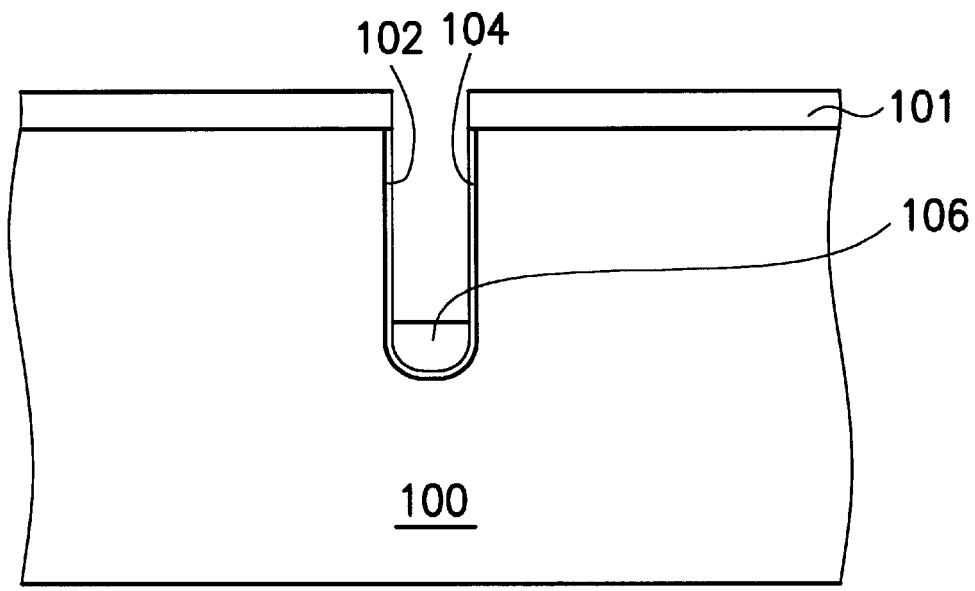

Then, as shown in FIG. 2C, a bottom oxide 106 having a thickness of about 2000 to 2500 angstroms is deposited over the pad oxide layer 104 by high density plasma chemical vapor deposition (HDPCVD) using ozone and tetraethylorthosilicate (TEOS) as the main reactive gas. The bottom oxide 106 serves as a passivation layer.

Figure 2D:
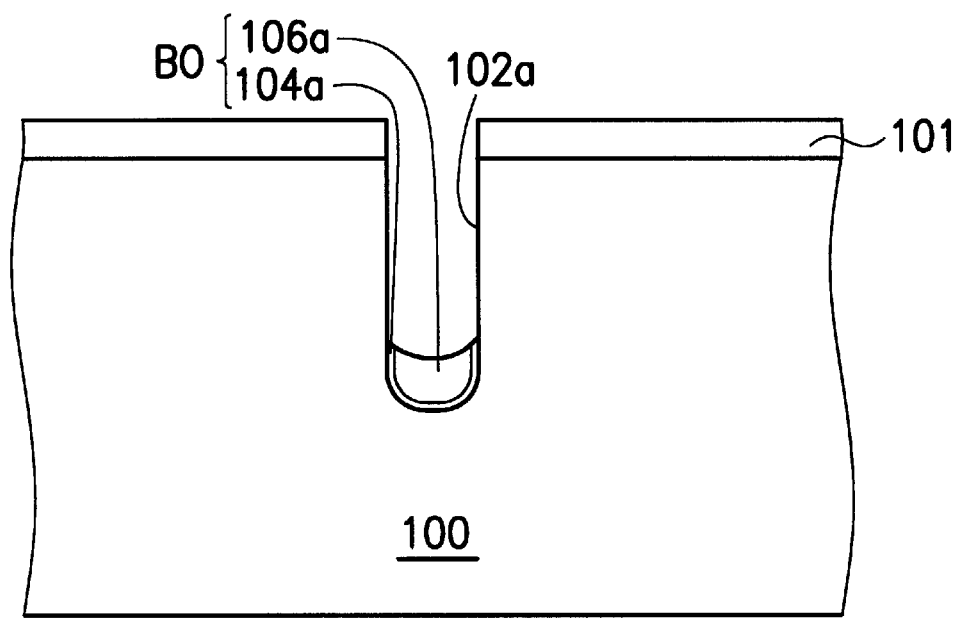

Referring now to FIGS. 2C and 2D, the upper portion of the bottom oxide 106 and the exposed pad oxide layer 104 are dipped away by 5% hydrogen fluoride solution to leave a bottom oxide BO having a concave surface and to expose the upper side walls 102a of the trench. The bottom oxide BO consists of the remaining pad oxide layer 104a and the bottom oxide 106a.

Figure 2E:
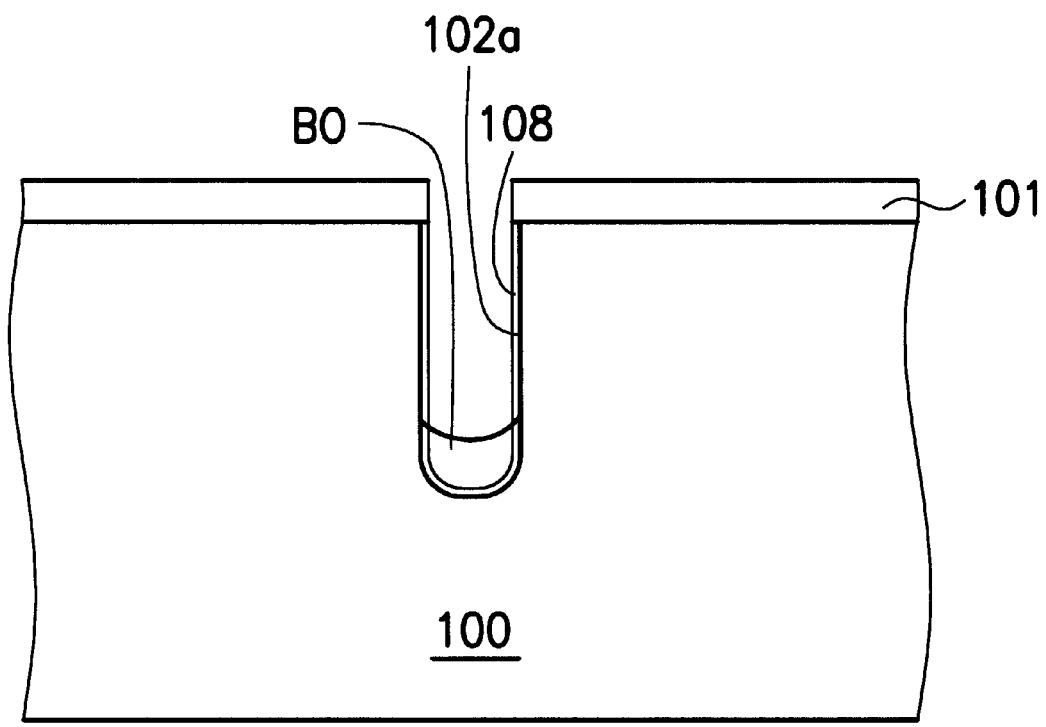

Referring now to FIG. 2E, a high quality conformal gate oxide layer 108, having a thickness of about 500 to 700 angstroms, is formed on the upper side walls 102a of the trench by a thermal oxidation process at a temperature of about 850 to 1000 degrees C.

Thereafter, the semiconductor devices (not shown) are completed by a number of conventional deposition, ion doping, and selective etching steps.

In order to avoid the problem of the formation of a thinner portion of the gate oxide layer at the junction between the side walls and the bottom oxide, a bottom oxide BO having a concave surface is formed on the lower portion of the trench 102. The conformal gate oxide layer 108 is grown on the exposed side walls of the trench. The thinner portion of gate oxide layer formed at the junction between the side walls and the bottom oxide in the conventional method is eliminated. Accordingly, junction leakage problems can be reduced.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method to prevent the formation of a thinner portion of insulating layer suitable for a semiconductor substrate having a trench comprising the steps of:

(a) forming a pad insulating layer on the side walls and the bottom of said trench;

(b) forming a bottom insulator over said pad insulating layer, said bottom insulator filled within said trench;

(c) etching the upper portion of said bottom insulator to form a bottom insulator having a concave surface; and (d) forming an insulating layer on the side walls of said trench.

2. A method to prevent the formation of a thinner portion of insulating layer as claimed in claim 1, wherein said pad insulating layer is a pad oxide layer.

3. A method to prevent the formation of a thinner portion of insulating layer as claimed in claim 2, wherein said pad oxide layer is formed by a thermal oxidation process.

4. A method to prevent the formation of a thinner portion of insulating layer as claimed in claim 2, where said pad oxide layer is formed by low pressure chemical vapor deposition (LPCVD).

5. A method to prevent the formation of a thinner portion of insulating layer as claimed in claim 1, wherein said bottom insulator is a bottom oxide.

6. A method to prevent the formation of a thinner portion of insulating layer as claimed in claim 5, wherein said bottom oxide is formed by high density plasma chemical vapor deposition (HDPCVD).

7. A method to prevent the formation of a thinner portion of insulating layer as claimed in claim 5, wherein said etching step is performed with hydrogen fluoride solution.

8. A method to prevent the formation of a thinner portion of insulating layer as claimed in claim 1, wherein said insulating layer in step (d) is a gate oxide layer.

9. A method to prevent the formation of a thinner portion of insulating layer as claimed in claim 8, wherein said gate oxide layer is formed by a thermal oxidation process.

10. A method to prevent the formation of a thinner oxide layer suitable for a semiconductor substrate having a trench comprising the steps of:

(a) forming a pad oxide layer on the side walls and the bottom of said trench;

(b) forming a bottom oxide over said pad oxide layer, said bottom oxide filled within said trench;

(c) etching the upper portion of said bottom oxide and said pad oxide layer to form a bottom oxide having a concave surface with an etching solution; and (d) forming an oxide layer on the side walls of said trench by thermal oxidation process.

11. A method to prevent the formation of a thinner oxide layer as claimed in claim 10, wherein said pad oxide layer in step (a) is formed by a thermal oxidation process.

12. A method to prevent the formation of a thinner oxide layer as claimed in claim 10, wherein said pad oxide layer in step (a) is formed by low pressure chemical vapor deposition (LPCVD).

13. A method to prevent the formation of a thinner oxide layer as claimed in claim 10, wherein said etching solution in step (c) is hydrogen fluoride solution.

14. A method to prevent the formation of a thinner oxide layer as claimed in claim 10, wherein bottom oxide in step (b) is formed by high density plasma chemical vapor deposition (HDPCVD).

15. A method to prevent the formation of a thinner oxide layer as claimed in claim 10, wherein said oxide layer in step (d) is a gate oxide layer.

16. A method to prevent the formation of a thinner oxide layer suitable for a semiconductor substrate having a trench comprising the steps of:

(a) forming a bottom insulator having a concave surface on the bottom of said trench; and (b) forming an oxide layer on the side walls of said trench.

17. A method to prevent the formation of a thinner oxide layer as claimed in claim 16, wherein said oxide layer in step (b) is formed by a thermal oxidation process.

* * * * *